United States Patent
Oh et al.

(10) Patent No.: US 7,645,695 B2
(45) Date of Patent: Jan. 12, 2010

(54) METHOD OF MANUFACTURING A SEMICONDUCTOR ELEMENT

(75) Inventors: Jun-hwan Oh, Incheon (KR); Hong-seong Son, Suwon-si (KR); Sang-min Lee, Seoul (KR); Ju-hyuck Chung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 236 days.

(21) Appl. No.: 11/730,665

(22) Filed: Apr. 3, 2007

(65) Prior Publication Data

US 2007/0232064 A1 Oct. 4, 2007

(30) Foreign Application Priority Data

Apr. 3, 2006 (KR) .................. 10-2006-0030291

(51) Int. Cl.
*H01L 21/4763* (2006.01)
(52) U.S. Cl. .................. 438/622; 438/617; 438/625; 438/906; 257/784; 257/759; 257/E21.224
(58) Field of Classification Search .................. 438/622, 438/704, 745, 750, 738, 617, 625, 906; 507/238; 257/784, 759, E21.224
See application file for complete search history.

(56) References Cited

U.S. PATENT DOCUMENTS

| | | | | |
|---|---|---|---|---|
| 5,126,210 A | * | 6/1992 | Wieserman et al. | ......... 428/469 |
| 5,871,672 A | * | 2/1999 | Murphy et al. | ............... 252/514 |
| 5,976,973 A | | 11/1999 | Ohira et al. | |
| 6,358,616 B1 | * | 3/2002 | Jennings | ..................... 428/450 |
| 6,723,626 B2 | | 4/2004 | Tsuchiya et al. | |
| 6,838,370 B1 | | 1/2005 | Niuya et al. | |
| 6,867,148 B2 | * | 3/2005 | Yates et al. | .................. 438/745 |
| 6,890,864 B2 | | 5/2005 | Aoki et al. | |
| 2001/0051440 A1 | * | 12/2001 | Torek et al. | .................. 438/745 |
| 2005/0233911 A1 | * | 10/2005 | Samuel | ....................... 507/238 |
| 2005/0260856 A1 | * | 11/2005 | Kim et al. | ..................... 438/704 |

FOREIGN PATENT DOCUMENTS

| | | |
|---|---|---|
| JP | 10-154712 | 6/1998 |
| JP | 2003-077918 | 3/2003 |
| JP | 2003-124316 | 4/2003 |
| KR | 10-2002-0019056 | 3/2002 |
| KR | 10-2003-0096707 | 12/2003 |
| KR | 10-2004-0083622 | 10/2004 |
| KR | 10-2005-0045524 | 5/2005 |

* cited by examiner

*Primary Examiner*—William M Brewster
*Assistant Examiner*—Wilner Jean Baptiste
(74) *Attorney, Agent, or Firm*—Lee & Morse, P.C.

(57) ABSTRACT

A method of manufacturing a semiconductor element, includes forming a lower metal wiring layer and an interlayer insulating film on a substrate, forming an opening through the interlayer insulating film, such that the opening is in communication with an upper surface of the lower metal wiring layer, cleaning the opening, forming a metal wiring line protecting film in the opening, such that the metal wiring line protecting film covers the lower metal wiring layer, washing the opening to remove the metal wiring line protecting film, such that a top surface of the lower metal wiring layer is exposed, and drying the substrate.

20 Claims, 10 Drawing Sheets

METHOD OF MANUFACTURING A SEMICONDUCTOR ELEMENT

BACKGROUND OF THE INVENTION

1. Field of the Invention

The present invention relates to a method of manufacturing a semiconductor element. In particular, the present invention relates to a method of manufacturing a semiconductor element having wiring lines with improved reliability.

2. Description of the Related Art

Highly integrated semiconductor elements may require reliable wiring lines. Such wiring lines may be made of materials, such as, for example, aluminum or copper. Copper may have a relatively high melting point as compared to aluminum, and therefore, may exhibit superior electro-migration, i.e., "EM," and stress-migration, i.e., "SM," characteristics and low relative resistance properties.

A conventional method of forming such wiring lines in a semiconductor element may be performed as follows. An interlayer insulating film and a lower metal wiring layer may be formed sequentially on a semiconductor substrate and an opening may be etched in the interlayer insulating film using a photoresist pattern as an etching mask. Next, the photoresist pattern may be removed by plasma ashing. Subsequently, any impurities generated during dry etching and plasma ashing, metal oxides formed on the lower metal wiring layer, charge-carrying components generated by plasma and the like may be removed from the opening by wet cleaning. Finally, an upper wiring layer may be formed by filling a conductive material into the opening of the interlayer insulating film to form wiring lines of the semiconductor element.

The conventional wet cleaning process for removing impurities, metal-oxides, and charge-carrying components may include application of a cleaning solution into the opening and performance of a washing process therein with deionized water. However, when a washing process using the deionized water is performed, the lower metal wiring layer may be exposed, thereby triggering oxidation or metal extraction therefrom. An oxidation or metal extraction from the lower metal wiring layer may generate voids therein during formation of the upper metal wiring layer, and, thereby, reduce overall reliability of the semiconductor element.

Accordingly, there exists a need for an improved method of forming a semiconductor element capable of providing reduced oxidation and metal extraction during formation of metal wiring layers thereof.

SUMMARY OF THE INVENTION

The present invention is therefore directed to a method of manufacturing a semiconductor element, which substantially overcomes one or more of the problems due to the limitations and disadvantages of the related art.

It is therefore a feature of an embodiment of the present invention to provide a method of manufacturing a semiconductor element that is capable of providing minimized oxidation and metal extraction from a lower metal wiring layer of a semiconductor element.

It is another feature of the present invention to provide a method of manufacturing a semiconductor element having wiring lines with an improved reliability.

At least one of the above and other features of the present invention may be realized by providing a method of manufacturing a semiconductor element, including forming a lower metal wiring layer and an interlayer insulating film on a substrate, forming an opening through the interlayer insulating film, such that the opening is in communication with an upper surface of the lower metal wiring layer, cleaning the opening, forming a metal wiring line protecting film in the opening, such that the metal wiring line protecting film covers the lower metal wiring layer, washing the opening to remove the metal wiring line protecting film, such that a top surface of the lower metal wiring layer is exposed, and drying the substrate.

Forming the metal wiring line protecting film in the opening may include forming the metal wiring line protecting film on a bottom surface of the opening, such that the metal wiring line protecting film is in communication with the lower metal wiring layer. Forming the opening is performed by a single damascene process or a dual damascene process.

Cleaning the opening may include a first cleaning, a drying, and a second cleaning. The first cleaning may be performed with a first cleaning solution for about 10 seconds to about 180 seconds. The drying may be performed between the first cleaning and the second cleaning for about 5 seconds to about 30 seconds. The second cleaning may be performed for about 30 seconds to about 120 seconds.

The cleaning may include using an aqueous metal wiring line protecting component. The aqueous metal wiring line protecting component may include an ascorbic acid, pentamethyl diethylene triamine (PMDETA), or ethylene glycol.

Washing may be performed for about 20 seconds or less. The method may further include filling the opening with a conductive material after drying the substrate.

In another aspect of the invention there is provided a method of manufacturing a semiconductor element with wiring lines, including providing a substrate, forming a first interlayer insulating film on the substrate, forming a lower metal wiring layer on the substrate, forming a second interlayer insulating film on the substrate to cover the lower metal wiring layer, forming an opening through the second interlayer insulating film, such that the opening is in communication with an upper surface of the lower metal wiring layer, performing a first cleaning of opening with a first cleaning solution to form a cleaned substrate, drying the cleaned substrate, filling a cleaning gel into the opening, performing a second cleaning of the substrate with a second cleaning solution to form a metal wiring line protecting film in communication with the lower metal wiring layer on a bottom surface of the opening, washing inner surfaces of the opening to remove the metal wiring line protecting film to expose the lower metal wiring layer, drying the washed substrate, and filling the opening with a conductive material.

Performing the first and second cleaning may include using an aqueous metal wiring line protecting component. The aqueous metal wiring line protecting component may include an ascorbic acid, pentamethyl diethylene triamine (PMDETA), or ethylene glycol. Additionally, employing the cleaning gel may include increasing a concentration of the aqueous metal wiring line protecting component in the first cleaning solution.

The first cleaning may be performed about 10 to 180 seconds. The drying may include removal of the first cleaning solution for about 5 seconds to about 30 seconds. The second cleaning may be performed for about 30 seconds to about 120 seconds. The washing may be performed for about 20 seconds or less. Forming of the opening may be performed by a single damascene process or a dual damascene process.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
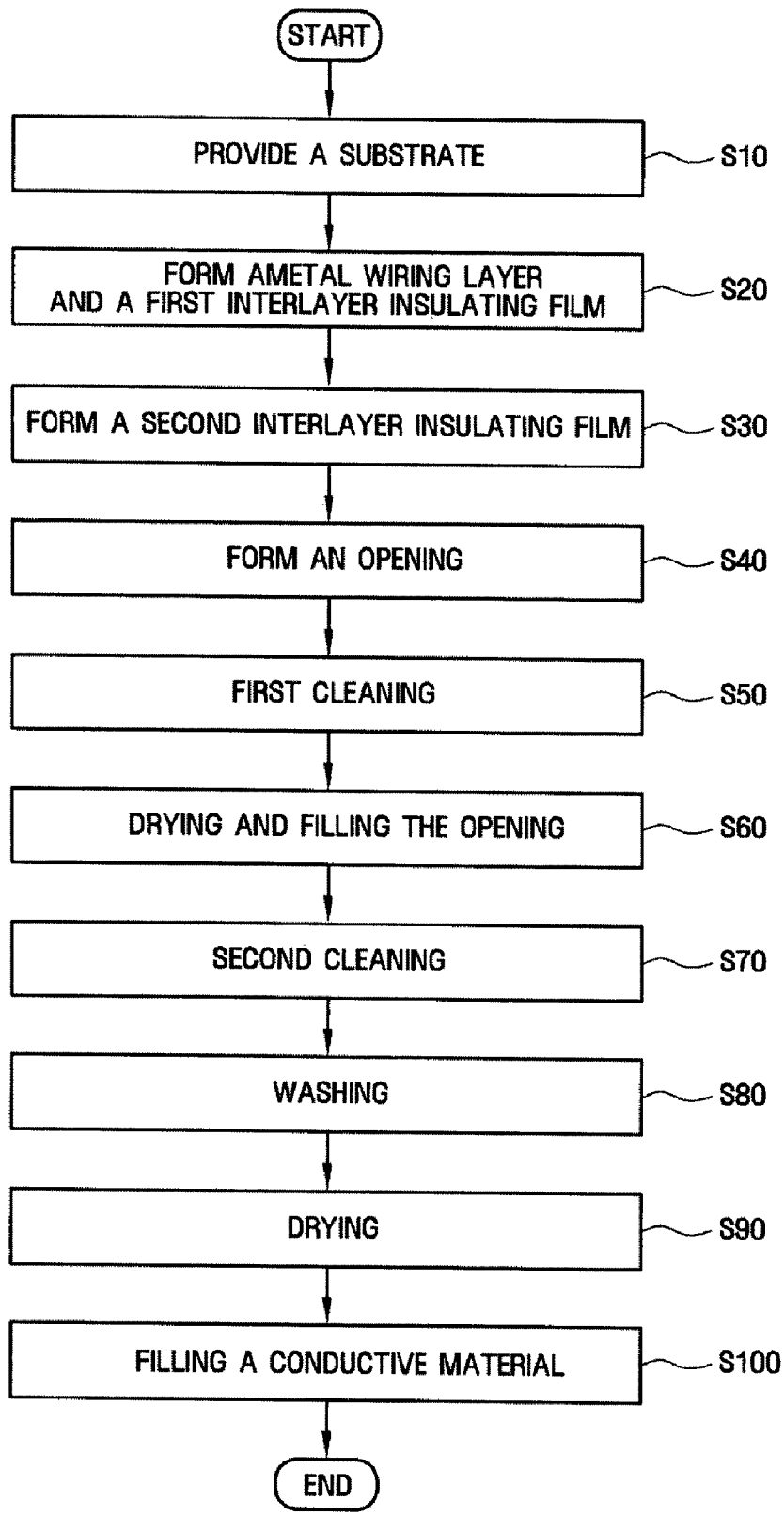
FIG. 1 illustrates a flowchart of a method of manufacturing a semiconductor element according to an embodiment of the present invention.

Korean Patent Application No. 10-2006-0030291 filed on Apr. 3, 2006, in the Korean Intellectual Property Office, and entitled: "Method of Manufacturing Semiconductor Element," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. Additionally, regions and elements illustrated in the figures may have schematic characteristics, and therefore, preferred embodiments of the present invention are not limited to specific configurations illustrated in the figures and may include modifications based on manufacturing techniques. For example, an etched region illustrated to have a right angle may be formed to have a curved shape.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will further be understood that an exemplified via-first dual damascene process is described in the present invention for ease of illustration only. Accordingly, other processes, e.g., trench-first dual damascene process, single damascene process, and so forth, are not excluded from the scope of the present invention.

An exemplary embodiment of a method of manufacturing a semiconductor element of the present invention will now be more fully described with reference to FIGS. 1-11.

Figure 2:
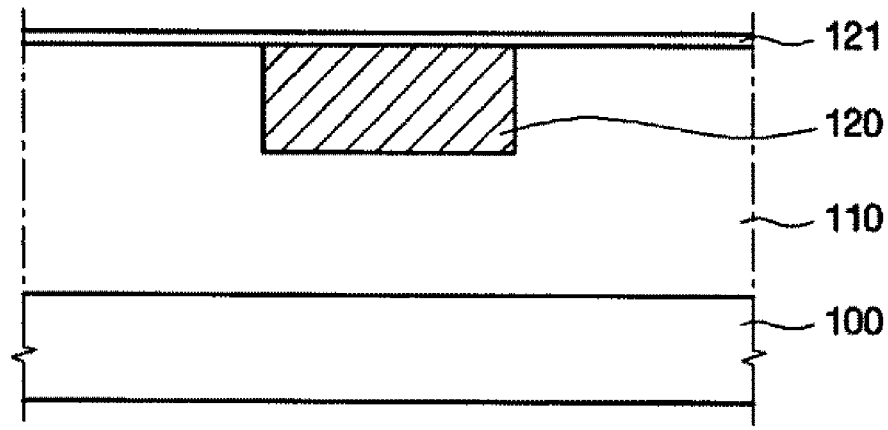
FIGS. 2 to 11 illustrate cross-sectional views of a semiconductor element during sequential stages of manufacturing thereof according to an embodiment of the present invention.

First, as illustrated in FIGS. 1-2, a substrate 100 may be provided, i.e., first step S10. The substrate 100 may be made of at least one semiconductor material as determined by one of ordinary skill in the art, e.g., silicon (Si), germanium (Ge), silicon germanium (SiGe), gallium phosphide (GaP), gallium arsenide (GaAs), silicon carbide (SiC), silicon germanium carbide (SiGeC), indium arsenide (InAs), indium phosphide (InP), and so forth. However, other types of semiconductor substrates, e.g., silicon-on-insulator (SOI) substrate, are not excluded from the scope of the present invention. Additionally, it should be noted that although not shown in the drawings, various active elements and/or passive elements, e.g., transistors, may be provided on the substrate 100.

Next, a first interlayer insulating film 110 and a lower metal wiring layer 120 may be formed on the substrate 100, i.e., second step S20. In particular, as illustrated in FIG. 2, the first interlayer insulating film 110 may be in contact with the substrate 100. Further, the lower metal wiring layer 120 may be formed by, for example, a damascene process in contact with the first interlayer insulating film 110. More specifically, the lower metal wiring layer 120 may be formed within the first interlayer insulating film 110, as illustrated in FIG. 2, or alternatively, the lower metal wiring layer 120 may be formed on the first interlayer insulating film 110 (not shown). The lower metal wiring layer 120 may be formed of at least one metal, e.g., copper, gold, silver, aluminum, a like metal, or an alloy thereof.

As further illustrated in FIG. 2, an etching stopping film 121 may be formed on the lower metal wiring layer 120. The etching stopping film 121 may minimize damage to the lower metal wiring layer 120 during the manufacturing process, improve etching precision, and reduce dispersion of metal wiring material.

Figure 3:
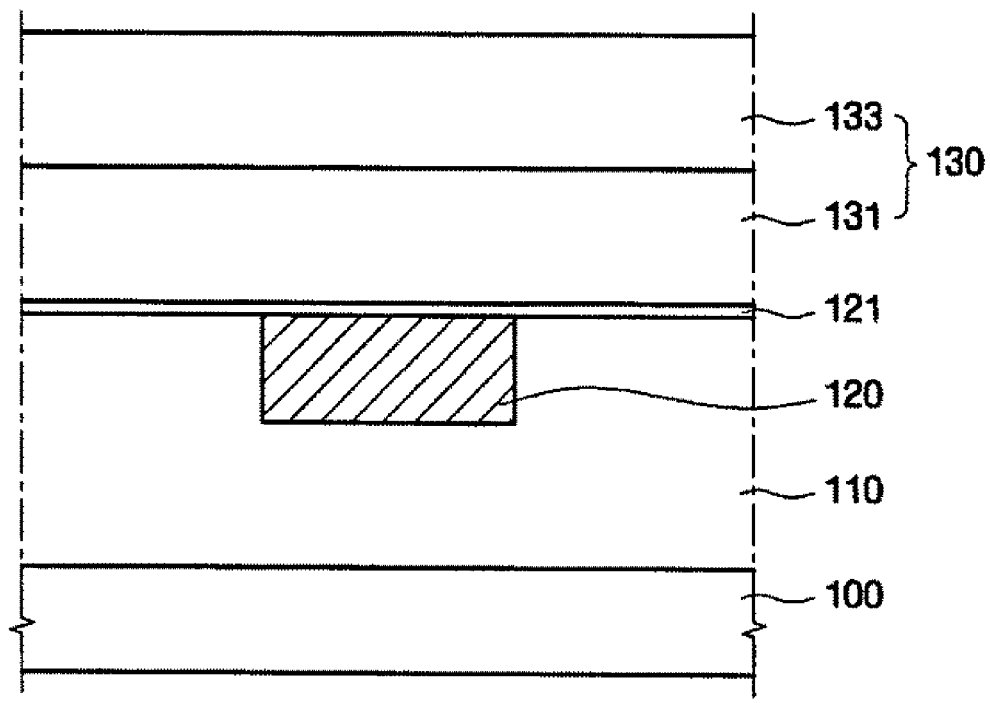

Subsequently, as illustrated in FIGS. 1 and 3, a second interlayer insulating film 130 may be formed on the lower metal wiring layer 120, i.e., third step S30. The second interlayer insulating film 130 may include a single layer or a laminated structure having a plurality of layers. Further, as illustrated in FIG. 3, if the second interlayer insulating film 130 is formed of a first layer 131 and a second layer 133, a predetermined etching stopping film (not shown) may be formed between the first and second layers 131 and 133. Alternatively, a predetermined etching stopping film may be formed on a top surface of each of the first and second layers 131 and 133.

The second interlayer insulating film 130 may be formed by, e.g., a chemical vapor deposition (CVD) method, of any suitable material as determined by one of ordinary skill, e.g., silicon oxide (SiOx), plasma enhanced-tetra ethyl ortho-silicate (PE-TEOS), plasma enhanced oxide (PEOX), fluoride silicate glass (FSG), a phosphor silicate glass (PSG), borophospho-silica glass (BPSG), undoped silica glass (USG), a low-k material, or a combination thereof. The etching stopping film may be formed, e.g., of silicon nitride by a CVD method.

Next, as illustrated in FIGS. 1 and 4-6, an opening 150 may be formed through the second interlayer insulating film 130 for exposing an upper surface of the lower metal wiring layer 120, i.e., fourth step S40.

Figure 4:
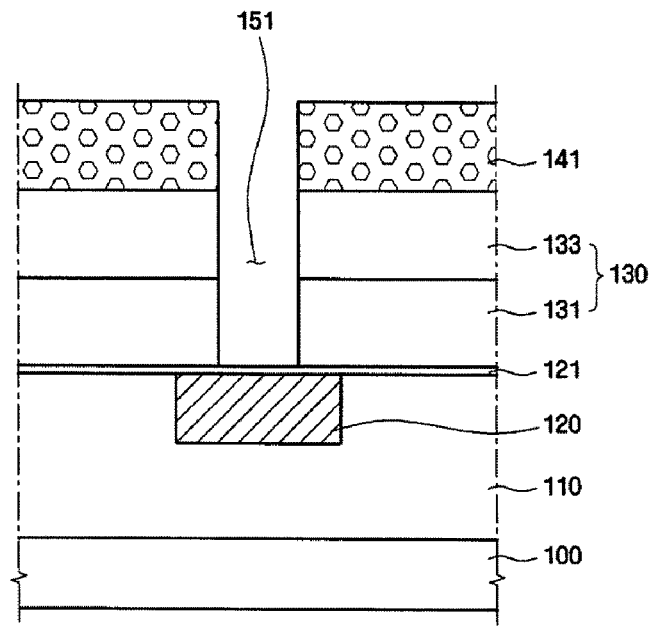

More specifically, as illustrated in FIG. 4, a first photo resist pattern 141 may be formed on the second interlayer insulating film 130, such that the second interlayer insulating film 130 may be etched by using the first photo resist pattern 141 as an etching mask to define a via hole 151. The etching of the second interlayer insulating film 130 may be performed by any method as determined by one of ordinary skill, e.g., dry etching using plasma. Once the via hole 151 is formed, the first photo resist pattern 141 may be removed, e.g., by an ashing process and a stripping process using plasma of $O_2$ gas, $N_2$ gas, $H_2$ gas, and like gases.

Figure 5:
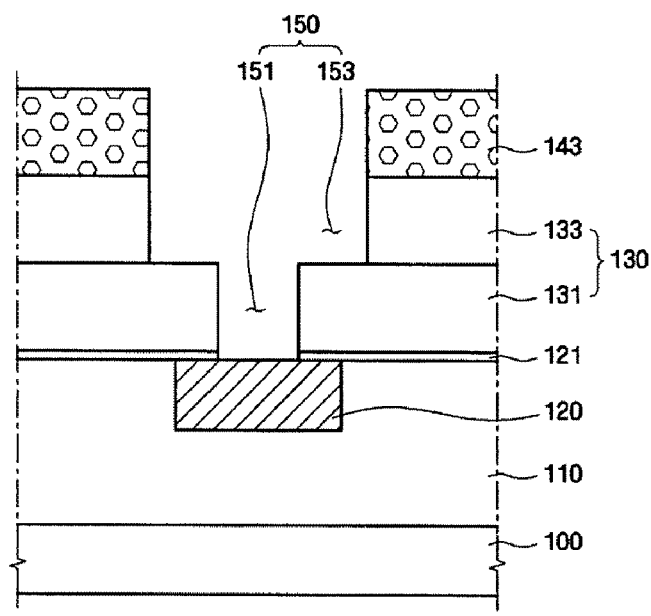

Then, as illustrated in FIG. 5, a second photo resist pattern 143 may be deposited on the second interlayer insulating film 130, such that a trench 153 may be etched through an upper part of the second interlayer insulating film 130, e.g., through the second layer 133. The trench 153 may be formed to have a width larger than a width of the via hole 151 and be in communication with the via hole 151 to form the opening 150, i.e., the opening 150 may be T-shaped. A portion of the etching stopping film 121 at a bottom part of the opening 150 may be removed to expose the upper surface of the lower metal wiring layer 120. Once the opening 150 is formed, the second photo resist pattern 143 may be removed by the same method employed for removing the first photo resist pattern 141.

Figure 6:
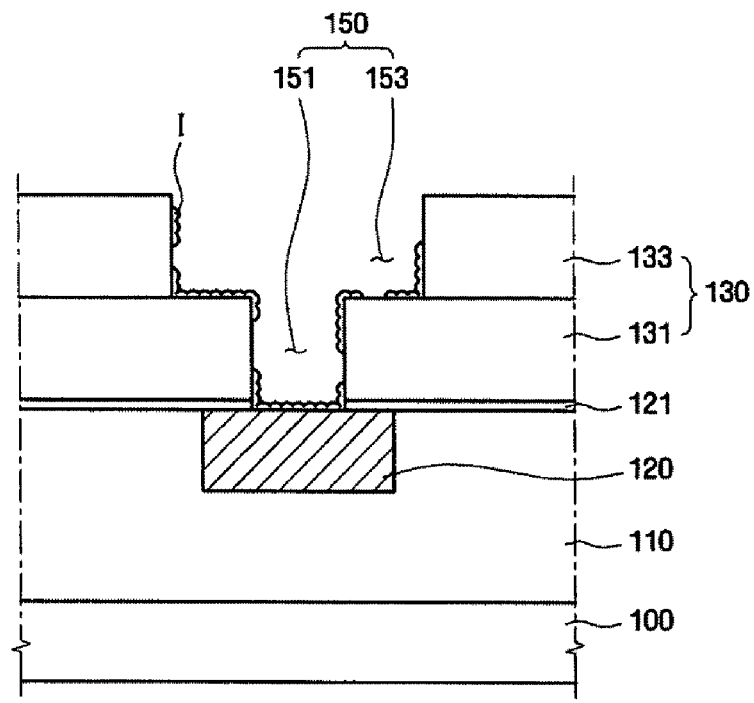

In this respect, it should be noted that formation of the opening 150, i.e. etching of the via hole 151 and trench 153, and formation/removal of the first and second photo resist patterns 141 and 143, may generate impurity layers I, i.e., unwanted etching residues, metal oxides, or charge-carrying components produced by plasma. Such impurity layers I may be formed on outer surfaces of the second interlayer insulating film 130, i.e., a top surface of the second interlayer insulating film 130 and inner surfaces of the second interlayer insulating film 130 that form sidewalls of the opening 150, and the lower metal wiring layer 120, as illustrated in FIG. 6.

Figure 7:
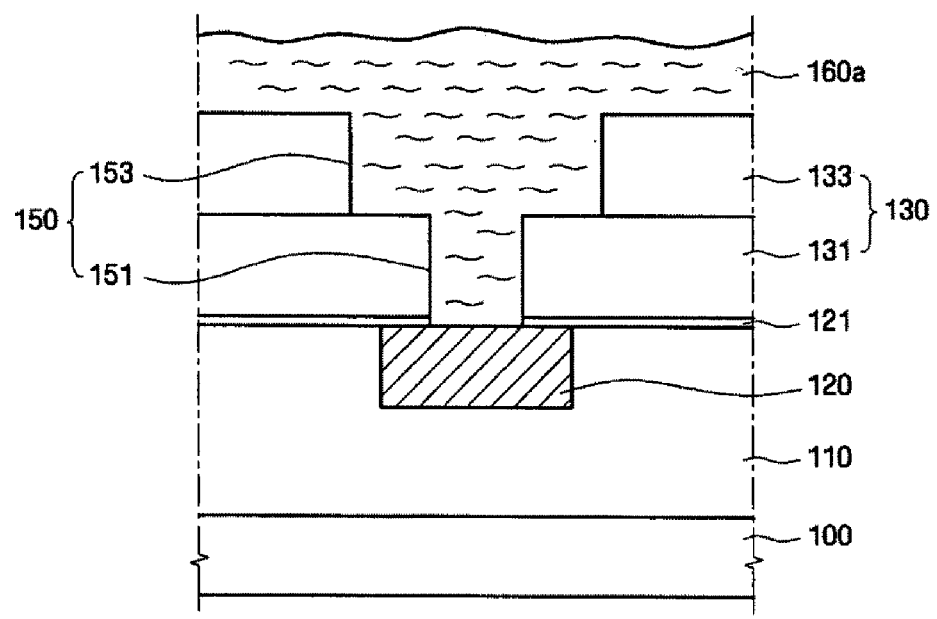

As illustrated in FIGS. 1 and 7, once the opening 150 is complete, a first cleaning process, i.e., fifth step S50, using a first cleaning solution 160a may be performed on an upper surface of the substrate 100, i.e., the second interlayer insulating film 130 and the lower metal wiring layer 120, to remove any potential impurity layers I therefrom. The first cleaning process may be performed by a single-sheet spin method, a single-sheet or an arrangement dipping method for about 10 seconds to about 180 seconds, and preferably for about 30 seconds to about 90 seconds, and most preferably for about 60 seconds. Performing the first cleaning for a duration that exceeds about 180 seconds may damage the lower metal wiring layer 120 and/or the second interlayer insulating film 130 while removing the impurity layer I.

The first cleaning solution 160a employed in the first cleaning process may be beneficial to remove any potential metal oxide components formed on surfaces of the opening 150 due to oxidation of exposed portions of the lower metal wiring layer 120. In particular, the first cleaning solution 160a according to an embodiment of the present invention may be aqueous and include a solvent and a metal wiring line protecting component.

More specifically, the solvent of the first cleaning solution 160a may be water, e.g., deionized water, alcohol, or any other suitable aqueous material as determined by one of ordinary skill in the art. The metal wiring line protecting component of the first cleaning solution 160a may be an aqueous material having a high water solubility and capable of minimizing corrosion or impurities adhesion to a surface of the metal wiring line 120. More specifically, the metal wiring line protecting component may be, for example, an ascorbic acid, pentamethyl diethylene triamine (PMDETA), ethylene glycol, or like materials. The first cleaning solution 160a may further include tetra-methylammonium hydroxide (TMAH), ethyl amine (EA), isopropyl alcohol (IPA), methyl alcohol, ethyl alcohol, a fluoric acid, an organic acid, ammonium hydroxide (NH4OH), like materials, or a combination thereof.

Once the first cleaning process is complete, the cleaned substrate 100 may be dried, e.g., spin drying, IPA spin drying, and so forth, for about 5 to 30 seconds. However, the drying time may be increased or decreased with respect to manufacturing specifications. Alternatively, the drying process may be performed by inflowing inert gas, e.g., nitrogen or argon, while maintaining the substrate 100 at room temperature. Another alternative includes performing the drying process in-situ with the first cleaning process. For example, after the first cleaning process is performed by a single-sheet spin method, a spin dry process may be performed without the inflow of the cleaning solution.

Figure 8:
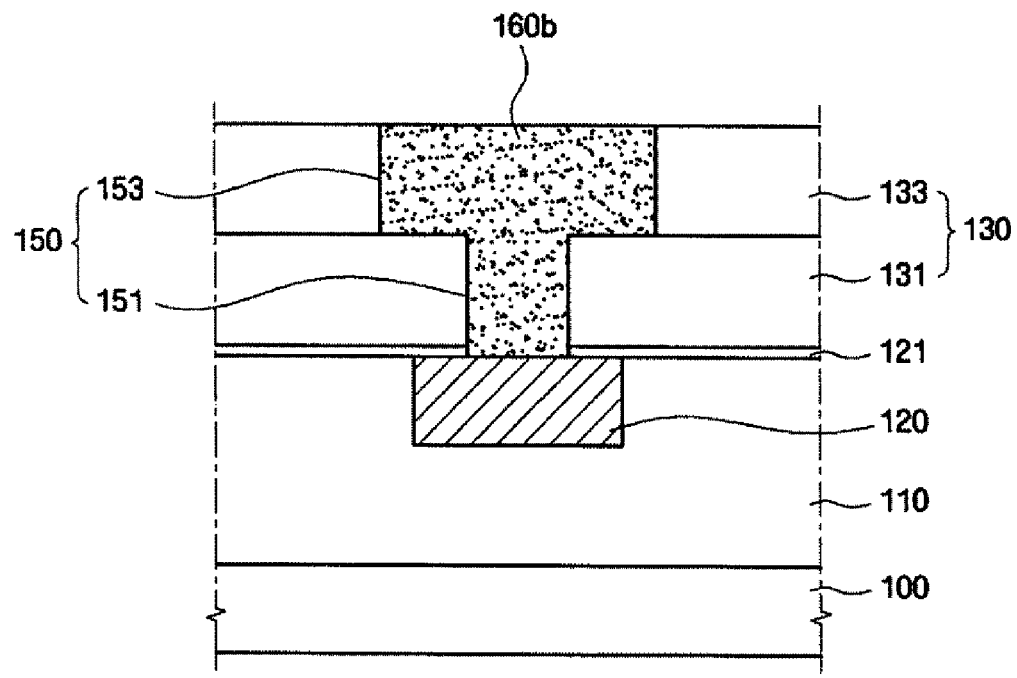

Subsequent to drying, i.e., once a portion of the solvent of the first cleaning solution 160a is removed from the opening 150, a cleaning gel 160b may be deposited into the opening 150, as illustrated in FIG. 8, to prevent contact between the lower metal wiring layer 120 and the exterior. The cleaning gel 160b may be deposited into the opening 150, such that an entire space of the opening 150 may be filled therewith, i.e., a height of the cleaning gel 160b in the opening 150 may be such that an upper surface of the cleaning gel 160b inside the opening 150 may be aligned with an upper surface of the second interlayer insulating film 130. It should be noted, however, that embodiments where the height of the cleaning gel 160b is above or below the upper surface of the second interlayer insulating film 130 are not excluded from the scope of the present invention.

The cleaning gel 160b may be obtained by increasing a concentration of the solute in the first cleaning solution 160a, i.e., the metal wiring line protecting component, to form a viscous gel. Without intending to be bound by theory, it is believed that use of the cleaning gel 160b may minimize contact between the lower metal wiring layer 120 and the exterior and, thereby, reduce recurring formation of an oxide layer on the lower metal wiring layer 120 after the first cleaning process.

Drying of the substrate 100 and its treatment with a cleaning gel 160b, as explained above, may be referred to as a sixth step S60 in FIG. 1.

Figure 9:
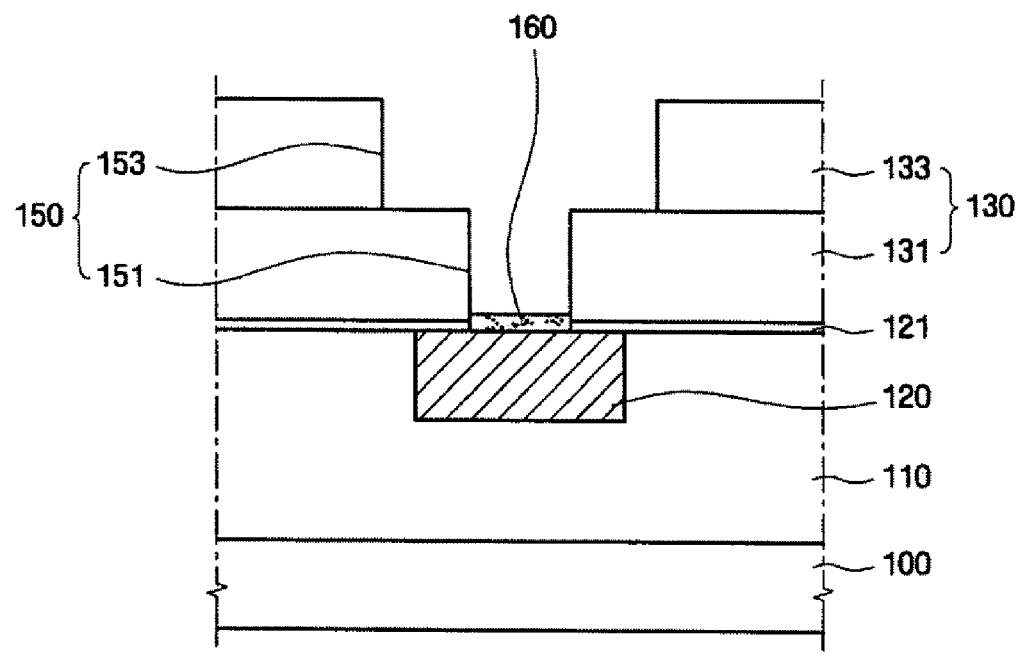

Next, as illustrated in FIGS. 1 and 9, a second cleaning process employing a second cleaning solution (not shown) may be performed, i.e., step S70. The second cleaning solution may be identical to the first cleaning solution. In particular, a portion of the cleaning gel 160b may be removed from the opening 150 and replaced with the second cleaning solution. The cleaning time of the second cleaning process may be adjusted such that an aqueous metal wiring line protecting film 160 may remain on the bottom of the opening 150, as illustrated in FIG. 9. More specifically, the second cleaning process may be performed for about 30 to 120 seconds, and preferably for about 60 to 90 seconds. As a result, the aqueous metal wiring line protecting film 160 may be in contact with the upper surface of the lower metal wiring layer 120, thereby minimizing contact between the lower metal wiring layer 120 and the exterior.

The second cleaning process may be performed in-situ with the above-mentioned dry process. Further, the second cleaning process can be performed by a single-sheet spin method, a single-sheet or arrangement dipping method, and so forth.

Figure 10:
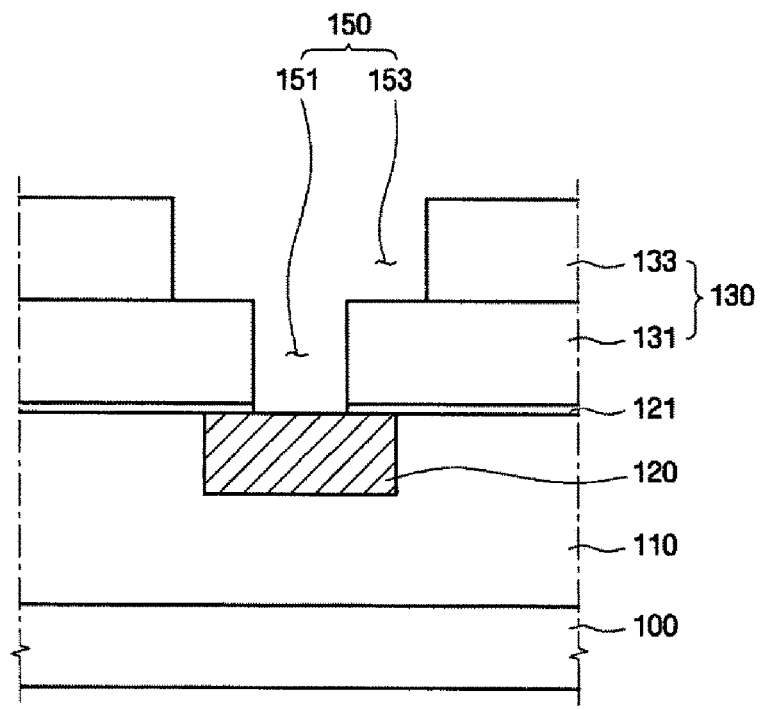

Next, as illustrated in FIGS. 1 and 10, a washing process is then performed as an eighth step S80. In particular, the washing process may be performed for about 20 seconds or less on the entire structure illustrated in FIG. 10 by a washing solution, i.e., any suitable liquid, e.g., deionized water, water-soluble aqueous alcohols, like liquids, or a mixtures thereof. Without intending to be bound by theory, it is believed that the washing process may remove any remaining impurities and residual components of the first cleaning solution 160a, cleaning gel 160b, and second cleaning solution from inner surfaces of the opening 150. The washing time may be increased or decreased with respect to process specification.

It should be noted, that the aqueous metal wiring line protecting film 160 may initially prevent contact between the upper surface of the lower metal wiring layer 120 and the washing solution. As the washing process progresses, the aqueous metal wiring line protecting film 160 may be removed as well, triggering exposure of the lower metal wiring layer 120 to the washing solution. However, the delayed exposure of the lower metal wiring layer 120 to the washing solution and the exterior may reduce the contact time therebetween, thereby minimizing oxidation or elution of the lower metal wiring layer 120. Accordingly, any impurities from the metal wiring layer 120 may be removed, while any defects, e.g., extracted metal components capable of generating voids and decreasing the semiconductor reliability, may be minimized.

Subsequent to the washing process, the structure illustrated in FIG. 10 may be dried as a ninth step S90. The drying process may be progressed in-situ with the washing process, and it may be performed for about 30 to 180 seconds by any suitable method as determined by one of ordinary skill, e.g., spin dry, Marangoni dry, IPA spin drying, and like methods. Further, when the substrate 100 temperature is maintained within a range of about 25 to 80° C., the dry process may be performed by inflowing nitrogen gas or argon gas at a temperature of about 25 to 80° C.

The washing process may be progressed in-situ with the above-described second cleaning process. Moreover, the first and second cleaning processes, the drying processes, and the washing process, may be progressed in-situ. For example, a substrate 100 may be provided, such that the opening 150 may be mounted on a spin chuck to rotate, the first cleaning process may be performed by inflowing the first cleaning solution, then the inflowing of the first cleaning solution may be stopped, and the dry process may be started. Then, the second cleaning process may be performed by inflowing the second cleaning solution, followed by the washing process performed by inflowing the washing solution replacing the second cleaning solution. The inflow of the washing solution may be stopped, and then the dry process may be progressed. However, other methods for performing either of the processes or portions thereof are not excluded from the scope of the present invention.

Figure 11:
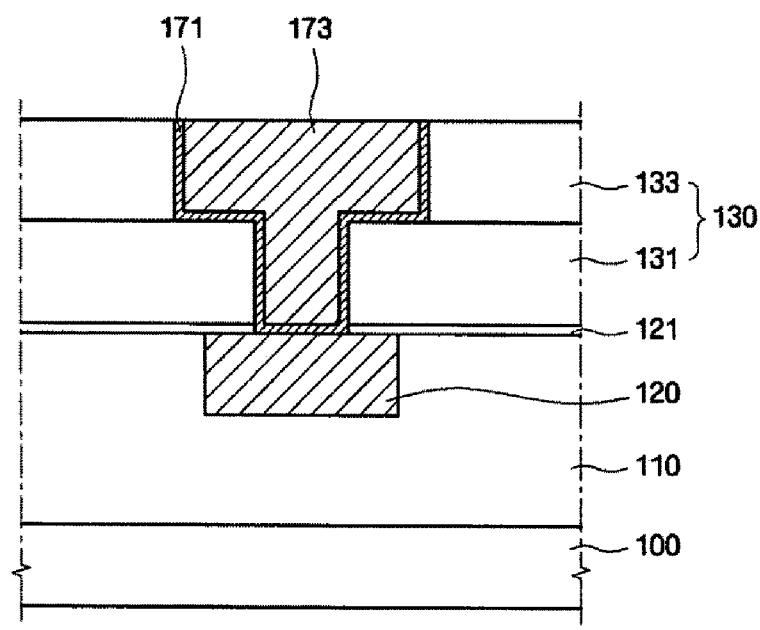

Subsequently, as illustrated in FIGS. 1 and 11, the opening 150 may be filled by a conductive material in step S100. First, a conformal barrier film 171 may be formed along the inner side surfaces of the opening 150 to minimize dispersion of damascene wiring lines in the via hole 151 and the trench 153. Dispersion of damascene wiring lines, e.g., dispersion of copper that has a large dispersion coefficient with respect to the material used for fabricating an integrated circuit, into the interlayer insulating film, e.g., a film made of SiO2, may impart conductivity to the interlayer insulating film, thereby lowering its insulating characteristic.

The barrier film 171 may be made of a material that does not interact with metals or has a high fusion point, e.g., titanium (Ti), tantalum (Ta), tungsten (W), ruthenium (Ru), titanium nitride (TiN), tantalum nitride (TaN), tungsten nitride (WN), titanium zirconium nitride (TiZrN), titanium silicon nitride (TiSiN), tantalum aluminum nitride (TaAlN), tantalum silicon nitride (TaSiN), tantalum silicide (TaSi2), titanium tungsten (TiW), or a combination thereof, by physical vapor deposition (PVD), atomic layer deposition (ALD), CVD, and the like.

Subsequently, a seed layer (not shown) may be formed on the barrier film 171. The seed layer may be deposited with a metal component by PVD.

Next, the opening 150 may be filled with a conductive material having a sufficient thickness for completely filling the opening 150 by an electroplating method, an electroless plating method, a metal organic chemical vapor deposition (MOCVD) method, or a like method. The conductive material may be copper, aluminum, silver, gold, and so forth, and it may be deposited on the lower metal wiring layer 120. A planarizing process may be performed to complete the damascene wiring line 173 to have a height substantially equal to a height of the interlayer insulating film 130, as illustrated in FIG. 11.

Figure 12A:
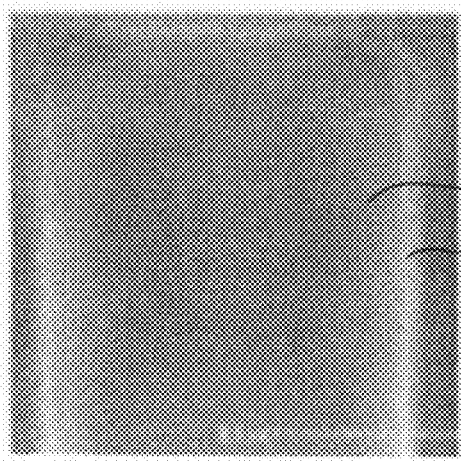
FIGS. 12A to 12C illustrate top view SEM images of a trench and a via hole of a semiconductor element after a first cleaning step, during the middle of a second cleaning step, and after a washing step, respectively, according to an embodiment of the present invention.
Figure 12B:
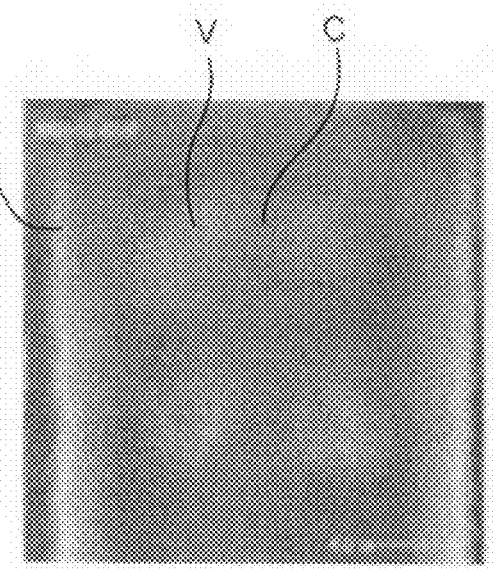
Figure 12C:
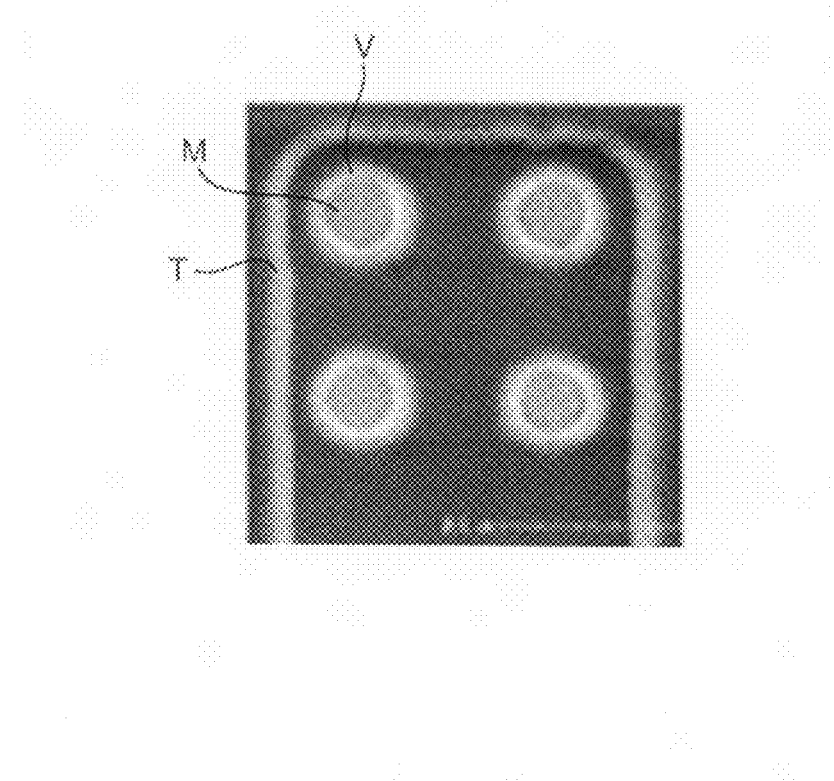

More detailed illustration of the semiconductor substrate of the present invention in steps S60 through S90, i.e., steps previously explained with respect to FIGS. 6-10, is provided by SEM images of top views of a trench T and at least one via hole V formed in the semiconductor substrate, i.e., FIGS. 12A-12C. In particular, subsequent to the first cleaning and drying of the trench T and the via hole V formed in the substrate, the trench T may be covered with a cleaning gel C, as illustrated in FIG. 12A. As can be further seen in FIG. 12A, the cleaning gel C may cover the trench T entirely, such that the via hole V may not be seen from the exterior.

As previously described with respect to FIG. 9, during the second cleaning process, some of the cleaning gel C may be removed from the trench T, such that the via hole V may be gradually exposed to the exterior, as illustrated in FIG. 12B.

Once the second cleaning and washing, as described previously with respect to FIG. 9 is complete, the via hole V may be seen through the trench T in FIG. 12C. It should be noted that no oxidized portions or extracted metal components may be seen in the trench at the end of the washing process.

The exemplary embodiment according to the present invention may further include additional processes apparent to those skilled in the art, e.g., formation of additional wiring lines, formation of a passivation layer, packaging of the substrate, and so forth.

EXAMPLES

In the following examples a trench and a via hole were formed in a semiconductor substrate according to the conventional art, i.e., Comparative Example 1, and according to the present invention, i.e., Example 1. The trench and via hole in Example 1 and Comparative Example 1 were formed through an interlayer insulating film and in communication with a lower metal wiring layer made of copper.

Figure 13A:
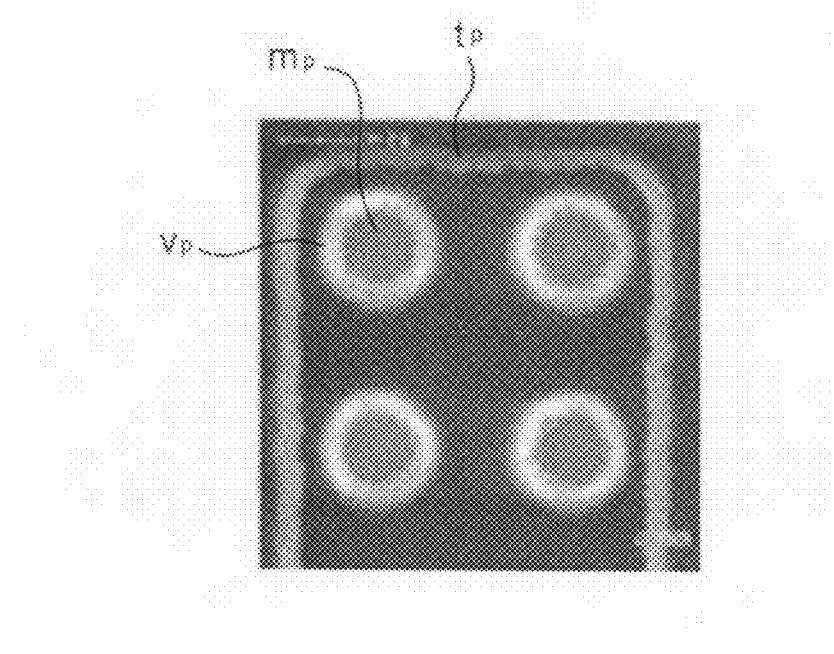
FIGS. 13A to 13B illustrate top view SEM images of a trench and a via hole of a semiconductor element manufactured according to a conventional method.
Figure 13B:
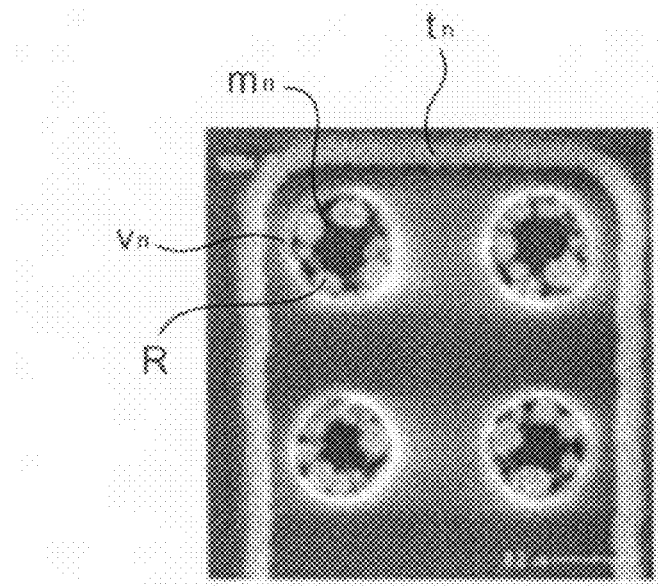

Comparative Example 1 after the trench and the via hole were formed, a cleaning process with a cleaning solution, a washing process, and a drying process were performed according to the conventional art. The cleaning solution included TMAH and an ascorbic acid. FIGS. 13A-13B illustrate the formed trench and via holes exposing the lower metal wiring layer formed on the P+ and N+ active regions, respectively.

As illustrated in FIG. 13A, the surface of the lower metal wiring layer $m_p$ exposed to the exterior through the via hole $v_p$ is damaged due to oxidation. Further, as illustrated in FIG.

13B, a plurality of metal components R are seen on the surface of the lower metal wiring layer $m_n$ due to metal extraction.

Example 1 after the trench and the via hole were formed, a cleaning process with a cleaning solution, a washing process, and a drying process were performed according to the present invention. More specifically, the first cleaning process was performed for 30 seconds, a spin drying process was performed for 10 seconds, a second cleaning process was performed for 60 seconds, and a washing processes and drying processes were performed. The cleaning solution included TMAH and an ascorbic acid.

Figure 14A:
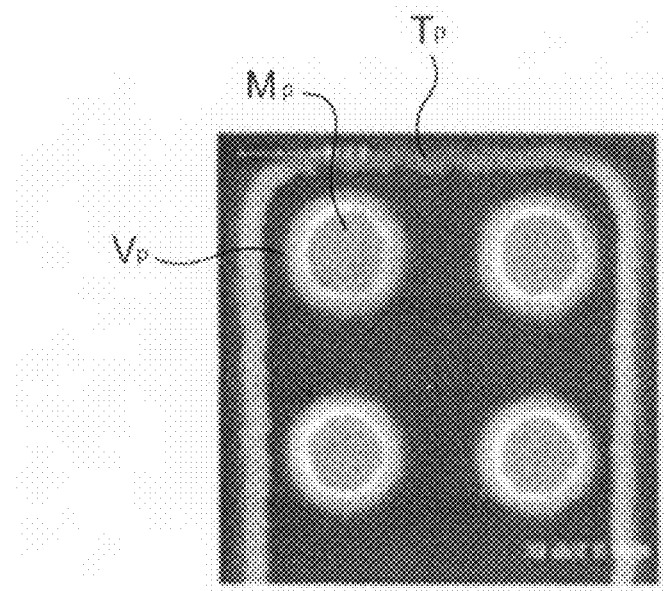
FIGS. 14A and 14B illustrate top view SEM images of a trench and a via hole of a semiconductor element according to an embodiment of the present invention.
Figure 14B:
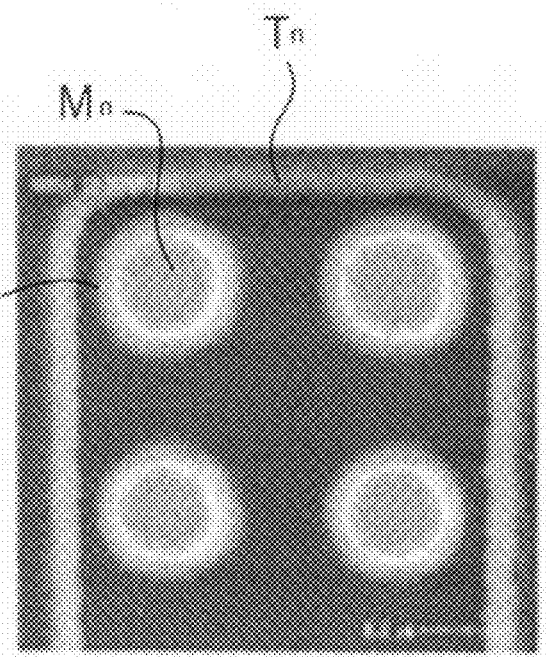

FIGS. 14A-14B illustrate the formed trench and via hole exposing the lower metal wiring layer formed on the P+ and N+ active regions, respectively.

As can be seen in FIGS. 14A-14B, the surfaces of the lower metal wiring layers $m_p$ and $m_n$ formed according to an embodiment of the present invention were not damaged by oxidation and had no extracted metal components despite exposure to the exterior through the via holes $v_p$ and $v_n$, as opposed to similar surfaces, illustrated in FIGS. 13A-13B, formed according to a conventional method.

The method of manufacturing a semiconductor element according to an embodiment of the present invention may provide an efficient removal of residual etching material and impurities, e.g., charge-carrying component or a metal oxide film, in the wiring line forming process. Additionally, the inventive method is advantageous in minimizing the exposure of the lower metal wiring layer to the exterior during the cleaning and washing processes. Further, the inventive method may provide minimized contact between the lower metal wiring layer and the water in the washing process, thereby reducing oxidation of the lower metal wiring layer and elution thereof. Finally, the method of manufacturing a semiconductor element according to an embodiment of the present invention may minimize generation of manufacturing defects, e.g., voids, in the upper metal wiring line and, thereby, overall reliability of the semiconductor element.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor element, comprising:
   forming a lower metal wiring layer and an interlayer insulating film on a substrate;
   forming an opening through the interlayer insulating film by etching using an etching mask, such that the opening is in communication with an upper surface of the lower metal wiring layer;
   removing the etching mask;
   cleaning the opening with a cleaning solution to form a metal wiring line protecting film in the opening, the metal wiring line protecting film being a concentrated material of the cleaning solution, such that the metal wiring line protecting film covers the lower metal wiring layer;
   washing the opening to remove the metal wiring line protecting film, such that a top surface of the lower metal wiring layer is exposed; and
   drying the substrate.

2. The method as claimed in claim 1, wherein forming the metal wiring line protecting film in the opening includes forming the metal wiring line protecting film on a bottom surface of the opening, such that the metal wiring line protecting film is in communication with the lower metal wiring layer.

3. The method as claimed in claim 1, wherein the cleaning solution includes a first cleaning solution and a second cleaning solution, cleaning the opening includes a first cleaning with the first cleaning solution, a drying, and a second cleaning with the second cleaning solution.

4. The method as claimed in claim 3, wherein the first cleaning is performed with the first cleaning solution for about 10 seconds to about 180 seconds.

5. The method as claimed in claim 3, wherein the drying is performed between the first cleaning and the second cleaning for about 5 seconds to about 30 seconds.

6. The method as claimed in claim 3, wherein the second cleaning is performed for about 30 seconds to about 120 seconds.

7. The method as claimed in claim 3, wherein the washing is performed for about 20 seconds or less.

8. The method as claimed in claim 1, wherein the cleaning includes using an aqueous metal wiring line protecting component.

9. The method as claimed in claim 8, wherein the aqueous metal wiring line protecting component includes an ascorbic acid, pentamethyl diethylene triamine (PMDETA), or ethylene glycol.

10. The method as claimed in claim 1, wherein forming the opening is performed by a single damascene process or a dual damascene process.

11. The method as claimed in claim 1, further comprising filling the opening with a conductive material after drying the substrate.

12. A method of manufacturing a semiconductor element with wiring lines, comprising:
    providing a substrate;
    forming a first interlayer insulating film on the substrate;
    forming a lower metal wiring layer on the substrate;
    forming a second interlayer insulating film on the substrate to cover the lower metal wiring layer;
    forming an opening through the second interlayer insulating film, such that the opening is in communication with an upper surface of the lower metal wiring layer;
    performing a first cleaning of the opening with a first cleaning solution to form a cleaned substrate;
    drying the cleaned substrate to form a cleaning gel in the opening, the cleaning gel being a concentrated material of the first cleaning solution;
    performing a second cleaning of the substrate with a second cleaning solution to form a metal wiring line protecting film in communication with the lower metal wiring layer on a bottom surface of the opening by removing a portion of the cleaning gel;
    washing inner surfaces of the opening to remove the metal wiring line protecting film and expose the lower metal wiring layer;
    drying the washed substrate; and
    filling the opening with a conductive material.

13. The method as claimed in claim 12, wherein performing the first and second cleaning includes using an aqueous metal wiring line protecting component.

14. The method as claimed in claim 13, wherein the aqueous metal wiring line protecting component includes an ascorbic acid, pentamethyl diethylene triamine (PMDETA), or ethylene glycol.

15. The method as claimed in claim 13, wherein employing the cleaning gel includes increasing a concentration of the aqueous metal wiring line protecting component in the first cleaning solution.

16. The method as claimed in claim 12, wherein the first cleaning is performed for about 10 to 180 seconds.

17. The method as claimed in claim 12, wherein the drying includes removal of the first cleaning solution for about 5 seconds to about 30 seconds.

18. The method as claimed in claim 12, wherein the second cleaning is performed for about 30 seconds to about 120 seconds.

19. The method as claimed in claim 12, wherein the washing is performed for about 20 seconds or less.

20. The method as claimed in claim 12, wherein forming of the opening is performed by a single damascene process or a dual damascene process.

* * * * *